(12) United States Patent
Chen et al.

(10) Patent No.: US 6,856,936 B1
(45) Date of Patent: Feb. 15, 2005

(54) METHOD AND SYSTEM TO PROVIDE AN IMPROVED TIME DOMAIN REFLECTROMETRY TECHNIQUE

(75) Inventors: Franz Chen, San Jose, CA (US); Kuo-Chung Lin, Fremont, CA (US)

(73) Assignee: Turnstone Systems, Inc., Santa Clara, CA (US)

( * ) Notice: Subject to any disclaimer, the term of this patent is extended or adjusted under 35 U.S.C. 154(b) by 93 days.

(21) Appl. No.: 10/210,555

(22) Filed: Jul. 31, 2002

Related U.S. Application Data

(60) Provisional application No. 60/310,046, filed on Aug. 2, 2001.

(51) Int. Cl.[7] .............................................. G01R 31/11
(52) U.S. Cl. ...................................... 702/159; 324/642
(58) Field of Search .............................. 702/65, 66, 69, 702/70, 71, 74, 158, 159; 324/534, 642, 644

(56) References Cited

U.S. PATENT DOCUMENTS

| | | | | |
|---|---|---|---|---|
| 5,321,632 A | * | 6/1994 | Otsuji et al. ................. | 702/159 |
| 5,479,251 A | * | 12/1995 | Hanson ....................... | 356/73.1 |
| 5,600,248 A | * | 2/1997 | Westrom et al. ............. | 324/522 |
| 6,385,561 B1 | * | 5/2002 | Soraghan et al. ........... | 702/185 |
| 6,393,316 B1 | * | 5/2002 | Gillberg et al. ............. | 600/515 |
| 6,538,451 B1 | * | 3/2003 | Galli et al. .................. | 324/533 |
| 6,646,451 B2 | * | 11/2003 | Lanan ......................... | 324/642 |

OTHER PUBLICATIONS

Gu et al., Estimation and Detection in OTDR Using Analyzing Wavelets, 1994 IEEE.*
Sarkar et al., A Tutorial on Wavelets from an Electrical Engineering Perspective, Part 2: The Continuous Case, 1998, IEEE.*
Liu et al., Detection and Estimation of Conection Splice Events in Fiber Optics Given Noisy OTDR Data—Part I: GSR/MDL Method, Feb. 2001, IEEE.*
Kim et al., Adaptive Processing Using a Single Snapshot for a Nonuniformly Spaced Array in the Presence of Mutual COupling and Near–Field Scatterers, May 2002, IEEE Transactions on Antennas and Propagation, vol. 50, No. 5.*

* cited by examiner

*Primary Examiner*—Donald E. McElheny, Jr.
*Assistant Examiner*—Craig Steven Miller
(74) *Attorney, Agent, or Firm*—Pillsbury Winthrop LLP

(57) ABSTRACT

Systems and methods to identify an event(s) representing a discontinuity in the impedance of a transmission line such as a wire cable using time domain reflectrometry (TDR) are presented. According to an exemplary embodiment, multiple layers of digital signal processing techniques are implemented in an algorithm that combats the smearing effect of a wide launch pulses with the reflection due to an event. The algorithm focuses on wavelet decomposition and additional post processing to produce a well-defined signal that allows easy identification of the reflected signal while preserving critical information, such as the location of the event and relative signal strength.

17 Claims, 17 Drawing Sheets

METHOD AND SYSTEM TO PROVIDE AN IMPROVED TIME DOMAIN REFLECTROMETRY TECHNIQUE

CROSS-REFERENCE TO RELATED APPLICATION

This application claims the benefit of prior U.S. Provisional Application Ser. No. 60/310,046, filed Aug. 2, 2001, which is hereby incorporated by reference herein.

TECHNICAL FIELD

The present invention generally relates to time domain reflectrometry (TDR) technology and, more particularly, to an improved processing technique used to process a TDR signal into a well-defined signal prior to applying loop inference methods.

BACKGROUND

In traditional time domain reflectrometry (TDR) systems, the length of, or the location of a fault or a discontinuity in, a wire cable can be determined by transmitting an electrical launch pulse down the length of the cable. Any change in the characteristic impedance of the transmission medium, i.e. the wire cable, will result in a reflection of the electronic pulse. A discontinuity can be caused by, for example, a change in the gauge of the medium, open termination of the medium, shorted termination of the medium, a load coil, a bridged tap, or splice faults in the medium. A bridged tap event is defined as a shorted event followed by an open event. Accordingly, upon reaching the end of the cable, or upon reaching the location of a fault or a discontinuity, the transmitted electronic pulse is reflected. The transmitted electronic pulse returns down the length of the cable to the point of origin.

A reflection of the transmitted pulse is also called an event. There might be multiple events associated with a single launch pulse. Since the velocity of propagation of the electronic launch pulse in the transmission media, e.g. wire cable, is known, the distance to the cable end, or to the fault location, may be precisely determined by measuring the time between the transmission of the electronic pulse and the return of the pulse reflection. Generally, the time between a launch pulse to an event represents twice the distance to the location of the discontinuity.

Methods of using peak detection to identify an event and to the associated location of the event are known. Special hardware is typically used to produce an optimum launch pulse. Typically, the transmitted launch pulse is narrow, however, various drawbacks are associated with narrow launch pulses. Reflections of narrow launch pulses are highly attenuated and relative noise is high. On longer loops, the reflections associated with the events have small signal to noise ratio and short reach, making the reflections difficult to detect.

While wider launch pulses may be used, these are accompanied by a host of other drawbacks. The falling edge of a wider launch pulse will tend to smear and interfere with the reflected pulse, again making the reflections difficult to detect. It is typically difficult to eliminate this smearing effect in hardware, and the smearing is also hardware dependent. It has been a challenge to find effective solutions to isolate the reflected pulse from the smearing due to the falling edge of the launch pulse.

To this end, a consistent method for processing and interpretation of TDR signals is needed.

SUMMARY

The presently preferred embodiments described herein include systems and methods for identifying an event(s) representing a discontinuity in the impedance of a transmission line using time domain reflectrometry (TDR). In a presently preferred embodiment, multiple layers of digital signal processing techniques are implemented in an algorithm that combats the smearing effect of a wide launch pulses with the reflection due to an event. The algorithm focuses on wavelet decomposition and additional post processing to produce a well-defined signal that allows easy identification of the reflected signal while preserving critical information, such as the location of the event and relative signal strength.

BRIEF DESCRIPTION OF THE DRAWINGS

The foregoing and other features, aspects, and advantages will become more apparent from the following detailed description when read in conjunction with the following drawings, wherein.

DETAILED DESCRIPTION OF THE PRESENTLY PREFERRED EMBODIMENTS

The present invention will now be described in detail with reference to the accompanying drawings, which are provided as illustrative examples of preferred embodiments of the present invention.

As described above, in time domain reflectrometry (TDR) applications, the falling edge of a wider launch pulse will tend to smear and interfere with the reflected pulse, making the reflections difficult to detect. Systems and methods to identify an event(s) representing a discontinuity in the impedance of a transmission line using TDR are presented. In a presently preferred embodiment, multiple layers of digital signal processing techniques are implemented in an algorithm that combats the smearing effect of a wide launch pulses with the reflection due to an event. The algorithm focuses on wavelet decomposition and additional post processing to produce a well-defined signal that allows easy identification of the reflected signal while preserving critical information, such as the location of the event and relative signal strength.

Figure 16:
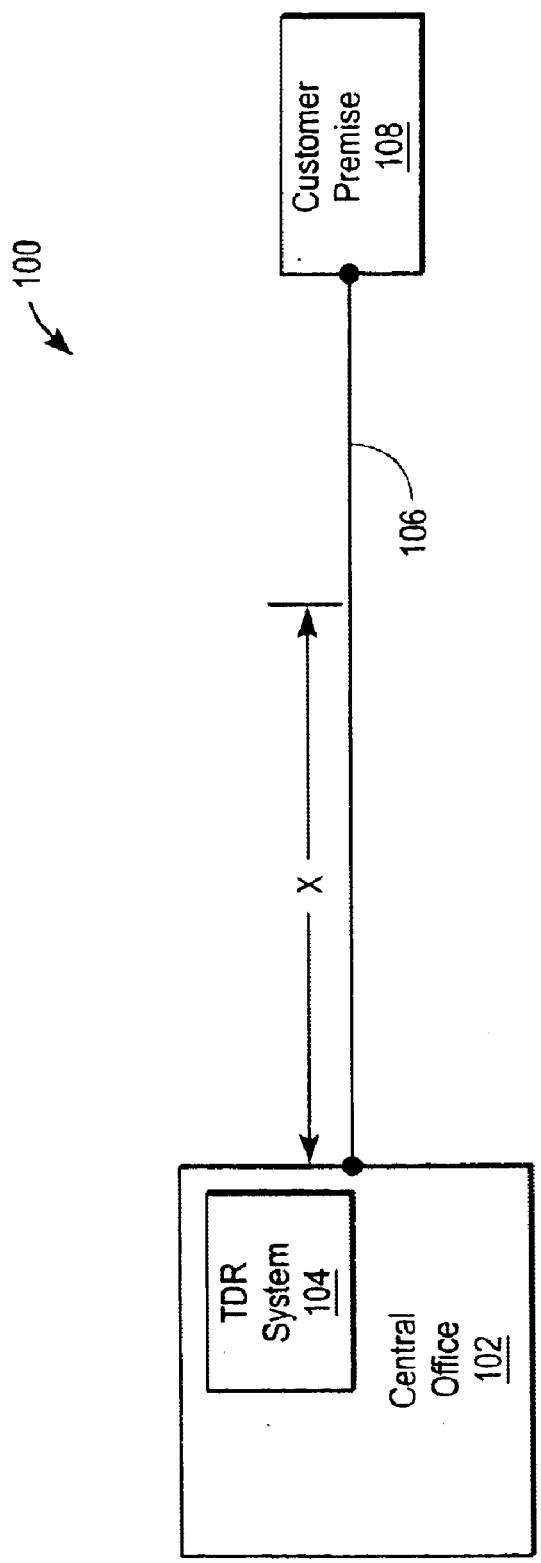
FIG. 16 is a diagram illustrating an exemplary TDR environment that includes a TDR system that incorporates a presently preferred embodiment.

Referring first to FIG. 16, it is a diagram illustrating an exemplary TDR environment 100 that includes a TDR system 104 that incorporates a presently preferred embodiment. A central office 102 is connected via a transmission line 106, for example, a wire cable 106, to, for example, at least one customer premise 108. By employing TDR techniques according to the present invention, a central office technician or a computer-implemented device, for example, can analyze the behavior of the transmission line 106 and identify events arising from discontinuities in the impedance of the transmission line 106. Preferably, the technician or other individual can identify events on the line 106 out to a distance X from the central office 102 or from the location of the TDR system 104. The TDR system 104 sends a launch pulse down the transmission line 106 and monitors the behavior of the transmission line 106. The distance X will in general depend on the available technology and could range up to 17,000 feet (15 kilofeet or 15 kft) or more. It is also noted that the TDR system 104 can be implemented outside the central office 102.

Algorithm Processing

Figure 17:
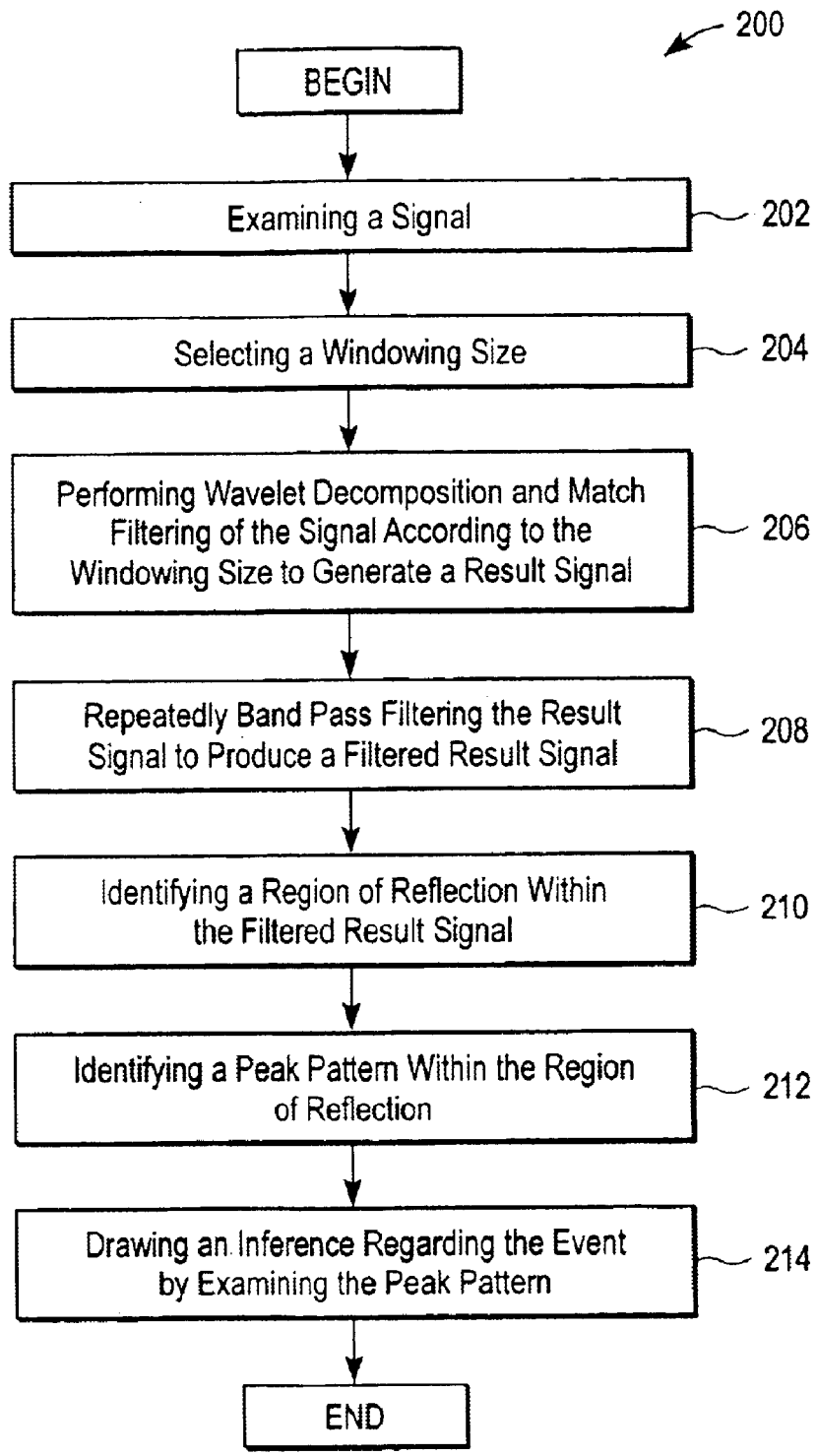
FIG. 17 is a flow diagram illustrating an exemplary method according to a presently preferred embodiment.

Referring now to FIG. 17, it is a flow diagram illustrating an exemplary method 200 according to a presently preferred embodiment. The method 200 characterizes specific steps of the overall algorithm. Processing of the exemplary method 200 begins at step 202 where the signal is examined. Preferably, a region of interest is selected from the signal in the time domain. Preferably, after the timing index of the launch pulse is identified, a segment of the signal in the time domain within which one or more events are expected to or might occur is selected. For example, if X in FIG. 16 is equal to 16 kft, and the expectation is that an event will occur between 9 kft from the central office 102 and the capture length is 30 kft, then the 30−9=21 kft will be the signal to be processed. Processing next advances to step 204 where a windowing size n is selected. At step 206, wavelet decomposition and match filtering of the signal are performed, preferably in one integrated step, according to the windowing size n to generate a result signal. Preferably, wavelet decomposition is performed on a small segment of the capture signal to obtain a corresponding set of sub-band signal. Preferably, the windowing size n of the small segment is equal to eight, although larger or small windowing sizes are also used as suitable. Preferably, a set of scalar is assigned to the sub-band signal forming a dot product. The result of the dot product between the sub-band signal and the weighted function is preferably aligned and stored to an array, thus forming a new signal set. In a presently preferred embodiment, this result signal is called wave(n), where n is the windowing size selected at step 204. Preferably, successive small segment in the time domain signal of equal windowing size is selected next and wavelet decomposition and matching filtering are performed on the successive small segments until the end of the time domain signal is reached. In a preferred embodiment, each successive small segment is selected by shifting by one data point in the time domain signal. For every windowing size that is used, a result signal wave(n) will be generated.

At step 208, the result signal is repeatedly band pass filtered to produce a filtered result signal. Preferably, band pass filtering is successively applied to the wave(n) data until the resulting filtered signal is considered optimum for the application. The band pass filtering can be implemented with, for example, a differentiator and a smoothing filter. In a presently preferred embodiment, the band pass filtered result signal data is called BPFout(n), where again n is the corresponding windowing size.

At step 210, at least one region of reflection within the filtered result signal is identified. Preferably, one or more segments on the filtered result signal BPFout(n) signal generated at step 208 are identified where one or more events may occur. In a presently preferred embodiment, this identification is achieved by performing an envelope detection on the moving average of the power on the signal BPFout(n). In a presently preferred embodiment, the moving average of the power on BPFout(n) is called Bumps(n). Preferably, an event is associated with each bump in the signal Bumps(n). In a presently preferred embodiment, the coverage of a particular bump is called the region of reflection. It should be understood that more than one region of reflection may be defined for a particular signal BPFout(n). Assuming for clarity that one region of reflection is identified, the region of reflection is used to mask the signal BPFout(n). That is, for the signal BPFout(n), the associated region of reflection in Bumps(n) is used as the mask, and anything outside the mask will be set to zero. In a presently preferred embodiment, the remaining masked data is called FinalData(n). Preferably, unwanted data are further masked out within the region of reflection, preferably according to a threshold derived from crest factor determined for each bump.

Processing continues to step 212 where a peak pattered is identified within the at least one region of reflection. Preferably, any local maxima and/or local minima are identified on the signal FinalData(n), which includes the region of reflection.

At step 214, an inference regarding the event is drawn by examining the peak pattern. Preferably, the algorithm draws inferences as to the nature of the event from the identified local maxima and/or minima that form the peak pattern within the region of reflection. The peak pattern will have a distinct pattern depending on the type of event, i.e. open, short, or bridged tap. Whether the peak pattern is identifiable as being indicative of a particular event depends on the inputs to the algorithm.

It should be understood that many variations of the algorithm are possible. Also, the inputs to the algorithm used above are variable. For example, the wavelet function, the windowing size, the crest factor, and the weighting function for the match filtering will drive the outcome of the algorithm for a given length of transmission line. In particular, as described below, the windowing size is preferably tuned and optimized for the particular length of transmission line, e.g. cable, that is used. Although numerous windowing sizes can be used to provide a variety of results, the algorithm may be properly run using only one windowing size.

Wavelet Function

Figure 1A:
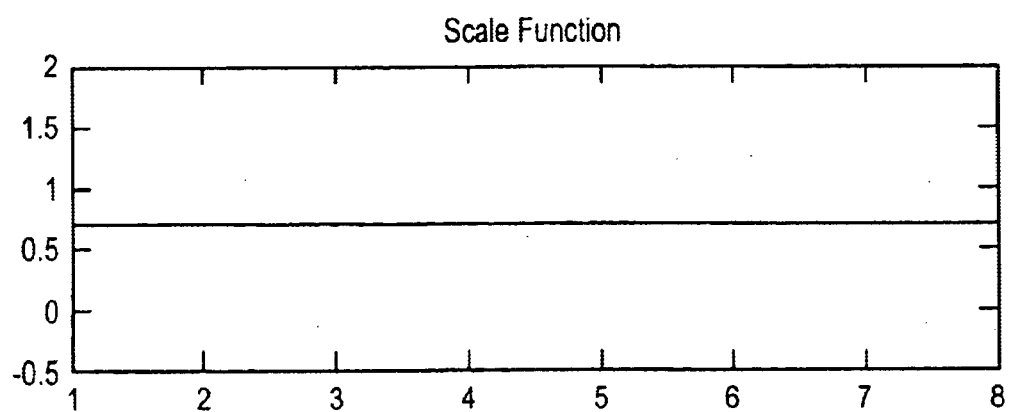
FIGS. 1A and 1B are graphs illustrating exemplary functions for wavelet processing (window size 8) according to a presently preferred embodiment.
Figure 1B:
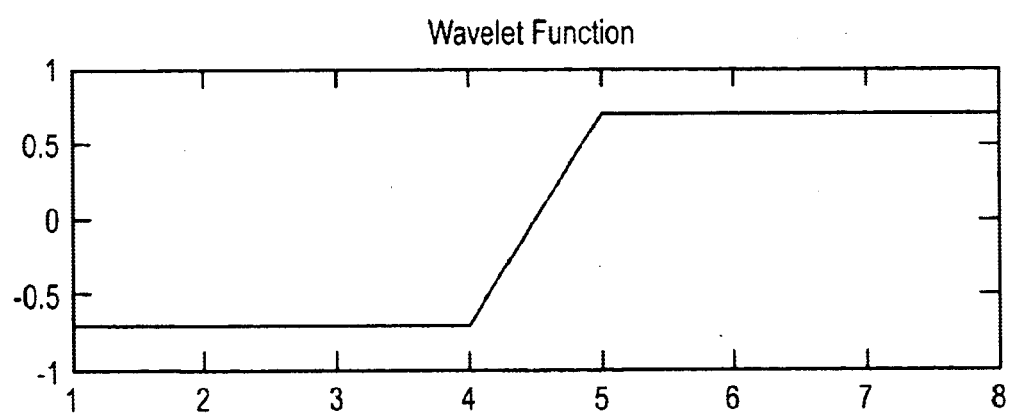

Referring now to FIGS. 1A and 1B, they are graphs illustrating exemplary functions for wavelet processing according to a presently preferred embodiment. In a presently preferred embodiment, the Harr wavelet function for either window size 8 or window size 64, which is equivalent to Daubichies 2 taps wavelet, is utilized in the algorithm. FIG. 1A illustrates a portion of the scale function and FIG. 1B illustrates a portion of the wavelet function in the time domain.

Figure 2A:
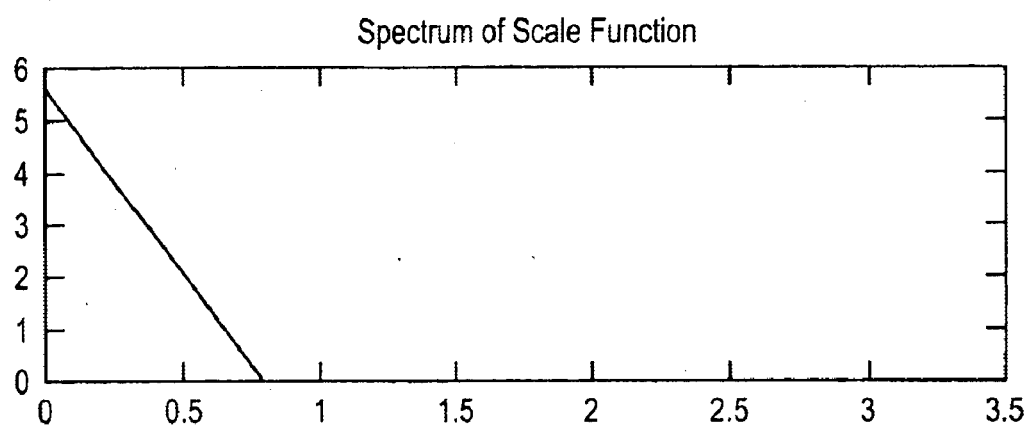
FIGS. 2A and 2B are graphs illustrating the spectra of the exemplary functions for wavelet processing of FIGS. 1A and 1B.
Figure 2B:
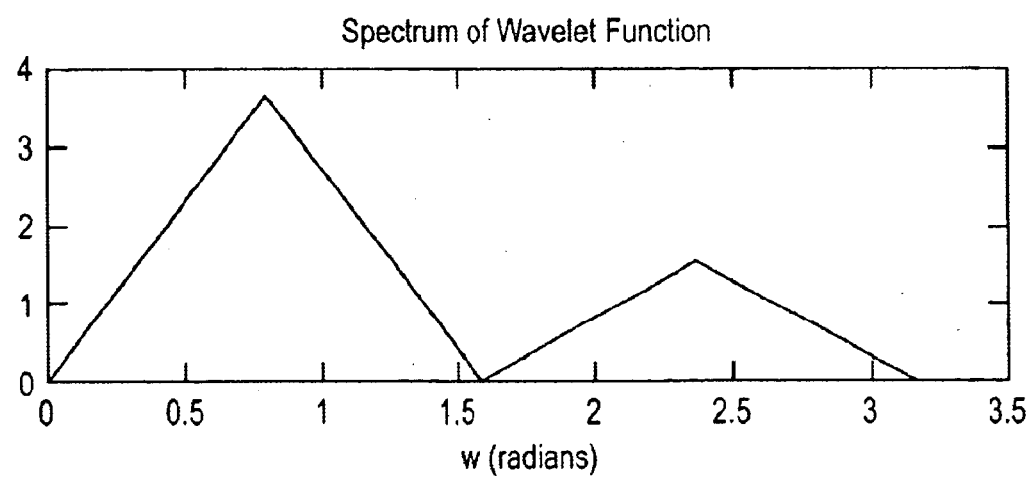

FIGS. 2A and 2B are graphs illustrating the corresponding spectra of the exemplary scale and wavelet functions of FIGS. 1A and 1B for wavelet processing.

Wavelet Transformation of Signal

In a presently preferred embodiment, the second index of the wavelet output is used with a corresponding weighted function is [0 1 0 0 . . . ]. This weighting function removes or reduces the DC and other unwanted sub-band components while still capturing essentially the abrupt change in the signal where the reflection begins. The wavelet decomposition and the match filtering (weighting function) are preferably integrated together in one step, although of course the decomposition and the match filtering could be performed separately as suitable.

Figure 3A:
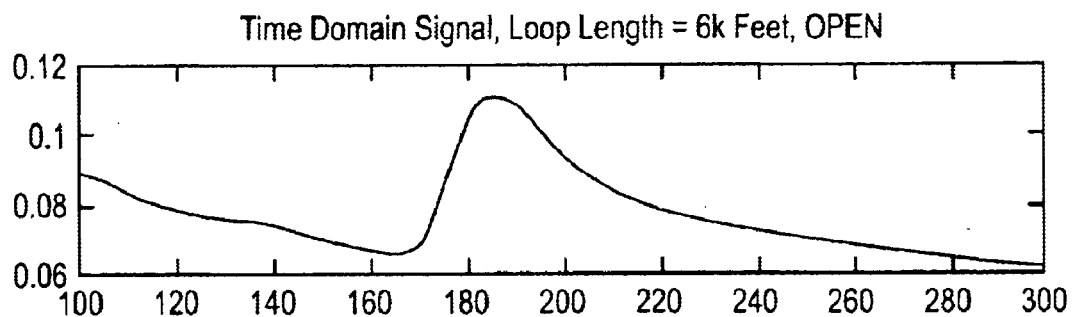
FIG. 3A is a graph illustrating the time domain signal capture on a first given loop length prior to wavelet processing.
Figure 3B:
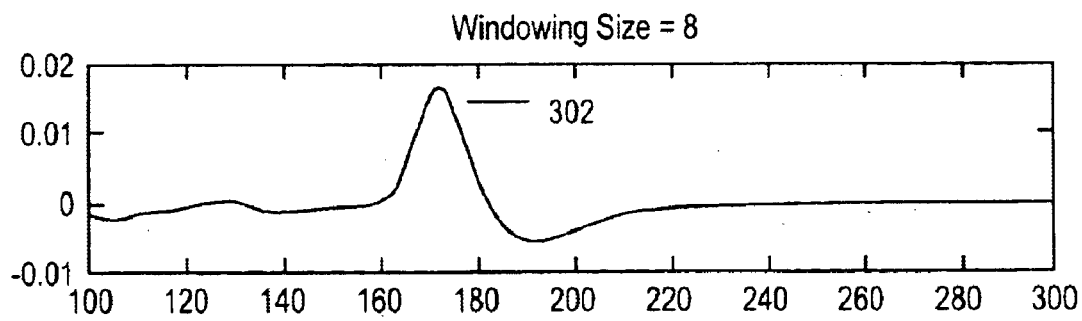
FIGS. 3B and 3C are graphs illustrating the data output of FIG. 3A following wavelet processing for two exemplary windowing sizes.
Figure 3C:
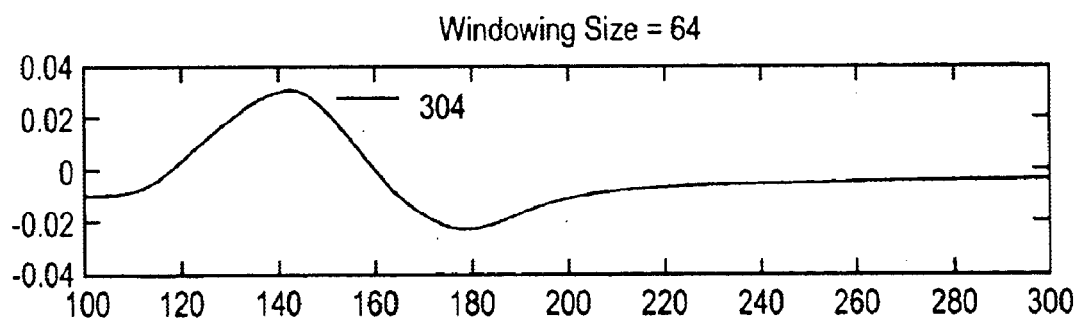
Figure 4A:
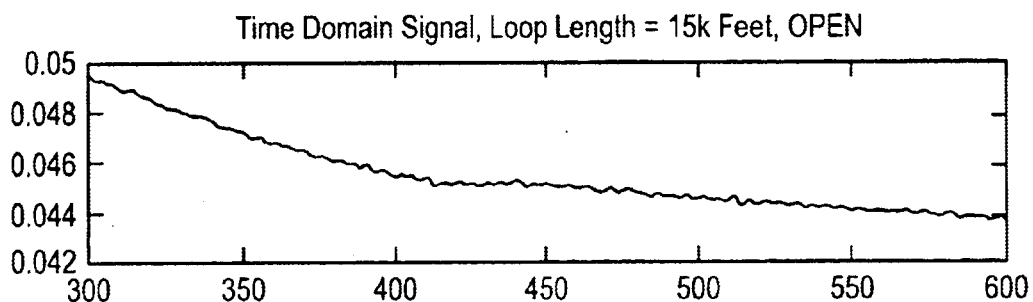
FIG. 4A is a graph illustrating the time domain signal capture on a second given loop length prior to wavelet processing.
Figure 4B:
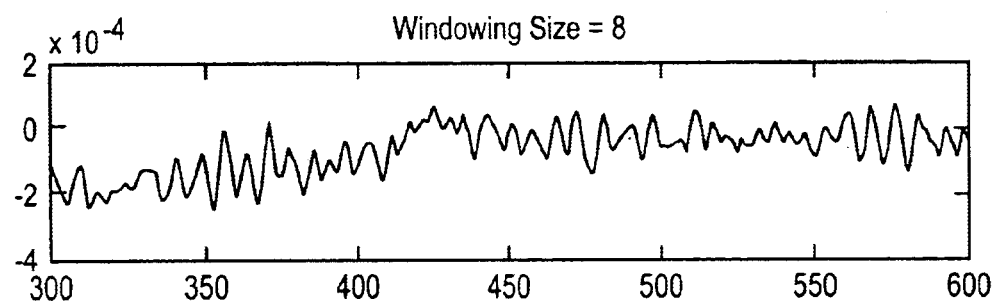
FIGS. 4B and 4C are graphs illustrating the data output of FIG. 4A following wavelet processing for two exemplary windowing sizes.
Figure 4C:
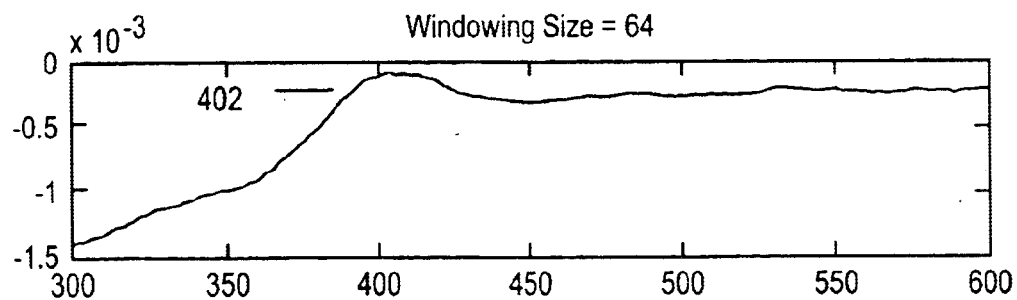
Figure 5A:
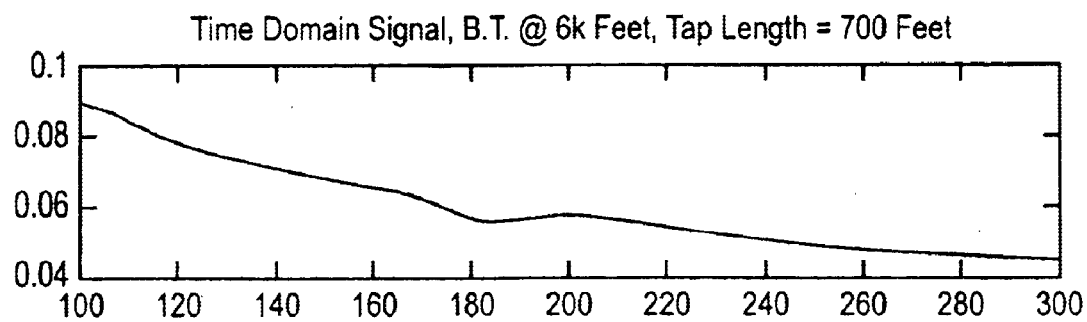
FIG. 5A is a graph illustrating the time domain signal capture on a loop having a bridge tap event occurring at a given distance prior to wavelet processing.

FIGS. 3 through 5 are the wavelet transform output for three different signal captures. Also, the unit on the x-axis of the graphs illustrated FIGS. 3A–15D represent steps of 0.12005 micro second. The first signal capture, shown in FIG. 3A, is on a loop of length 6 kft. The second signal capture, shown in FIG. 4A, is on a loop of length 15 kft. The last signal capture, shown in FIG. 5A, is on a loop with a bridge tap at 6 kft with tap length equal to 700 feet.

Referring to FIG. 3A, it is a graph illustrating the time domain signal capture on a loop length of 6 kft prior to wavelet processing. FIGS. 3B and 3C are graphs illustrating the data output of FIG. 3A following wavelet processing, i.e. the weighted wavelet transform using the Harr function, for two exemplary windowing sizes, 8 and 64 respectively. The launch pulse is $0.64 \times 10^{-6}$ sec (us) and the loop is a 24 American wire gauge (awg) cable. As can be seen from the FIGS. 3B and 3C, the wavelet transform output effectively removes the DC and other undesired component of the signal and results in a significant peak 302, 304 at the associated open event location.

Referring to FIG. 4A, it is a graph illustrating the time domain signal capture on a loop length of 15 kft prior to wavelet processing. FIGS. 4B and 4C are graphs illustrating the data output of FIG. 4A following wavelet processing, i.e. the weighted wavelet transform using the Harr function, for two exemplary windowing sizes, 8 and 64 respectively. Unlike the example shown in FIGS. 3B and 3C, the reflection due to the open event in FIG. 4B cannot be detected in the time domain. When the windowing size is set to be 64, as in FIG. 4C, a significant bump 402 becomes detectable. One difficulty here, however, is that the peak 402 is embedded in a rising slope that prevents direct detection of the open event using threshold detection. Other signal processing steps that follow will address this difficulty.

Figure 5B:
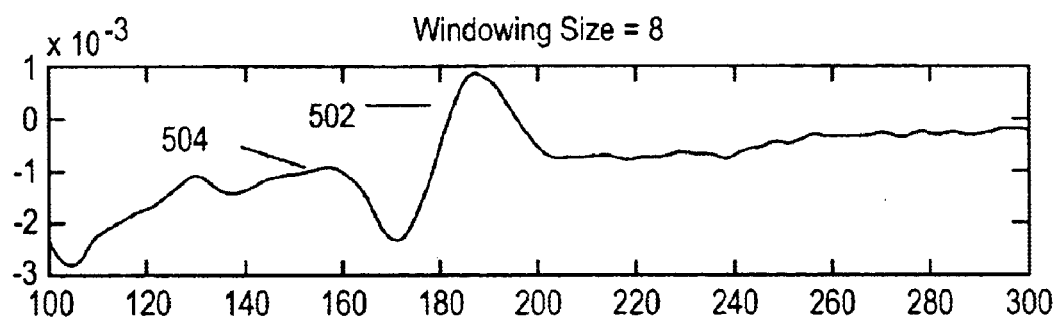
FIGS. 5B and 5C are graphs illustrating the data output of FIG. 5A following wavelet processing for two exemplary windowing sizes.
Figure 5C:
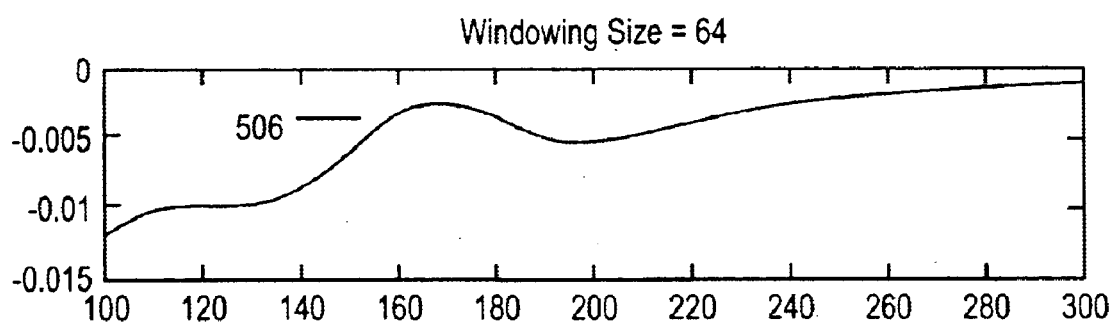

Referring to FIG. 5A, it is a graph illustrating the time domain signal capture on a loop having a bridge tap event prior to wavelet processing. The bridge tap event is located at a distance of 6 kft and has a tap length of 700 feet. FIGS. 5B and 5C are graphs illustrating the data output of FIG. 5A following wavelet processing, i.e. the weighted wavelet transform using the Harr function, for two exemplary windowing sizes, 8 and 64 respectively. The output in FIG. 5B, as expected, shows two peaks 502, 504 associated with the bridge tap events embedded in a DC decaying signal. FIG. 5C shows only a large bump 506, with the peaks embedded in the rising slope that prevents direct detection of the event using threshold detection.

As can be seen from FIGS. 4B, 4C, 5B and 5C, the magnitude of the bump in the wavelet output decays as the loop length increases. In addition, the DC and low frequency component of the wavelet output becomes relatively large for long loops or for the bridge tap event case. The wavelet output did not completely remove undesired low frequency components. For longer loop lengths or for the bridge tap event case, direct use of the wavelet transform output at this stage to identify the peak(s) and locate the event(s) is problematic as the peak(s) are interfered by the low frequency component. Successively applying the difference and smoothing to the data alleviates the interference. Instead of using the wavelet output directly, the procedure as described in step (6) above is applied to reduce the DC component.

Band Pass Filtering Of The Wavelet Transform Output

The reflection signal coming from a long loop will be showing more "stretch out" than that from a short loop because of the low pass characteristics of the loop under test. For a given mother wavelet and a given corresponding weighting function, it is intuitive that a longer window size should be used to properly capture the low frequency component for the events caused by a long loop. The following FIGS. 6A and 6B, 7A and 7B, and 8A and 8B show the output after applying the band pass filtering on the wavelet transform output as described in step (6). FIGS. 6A and 6B, 7A and 7B, and 8A and 8B further demonstrate the impact of using different windowing sizes for different loop lengths.

Figure 6A:
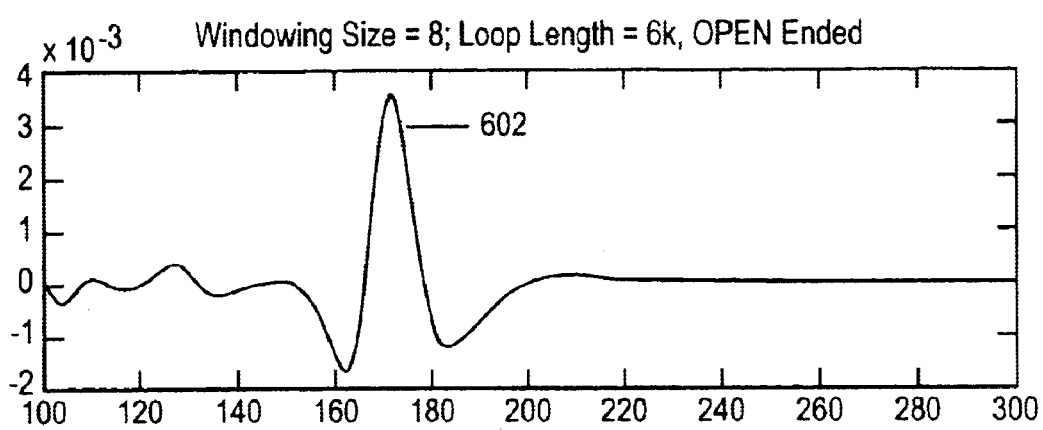
FIG. 6A is a graph illustrating the wavelet processed data output of FIG. 3B following applying the difference and smoothing.
Figure 6B:
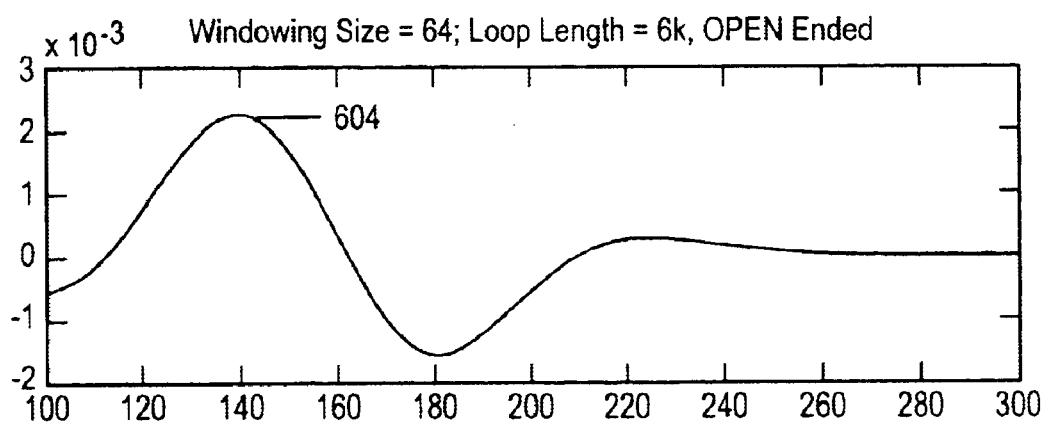
FIG. 6B is a graph illustrating the wavelet processed data output of FIG. 3C following applying the difference and smoothing.

FIGS. 6A and 6B are graphs illustrating the wavelet processed data output of FIGS. 3B and 3C, respectively, following applying the difference and smoothing. FIG. 6A shows BPFout(8) and FIG. 6B shows BPFout(64) for the open ended loop of length 6 kft. In both cases, the outputs show significant peak 602, 604. However, the windowing size n=8 in FIG. 6A is large enough to sufficiently capture the essential signal. Note here that when the windowing size n is set to 64 as in FIG. 6B, the peak 604 appear to be more advanced in time than using windowing size n=8 (FIG. 6A). Increasing the windowing size has significant impact when the loop is of short length.

Figure 7A:
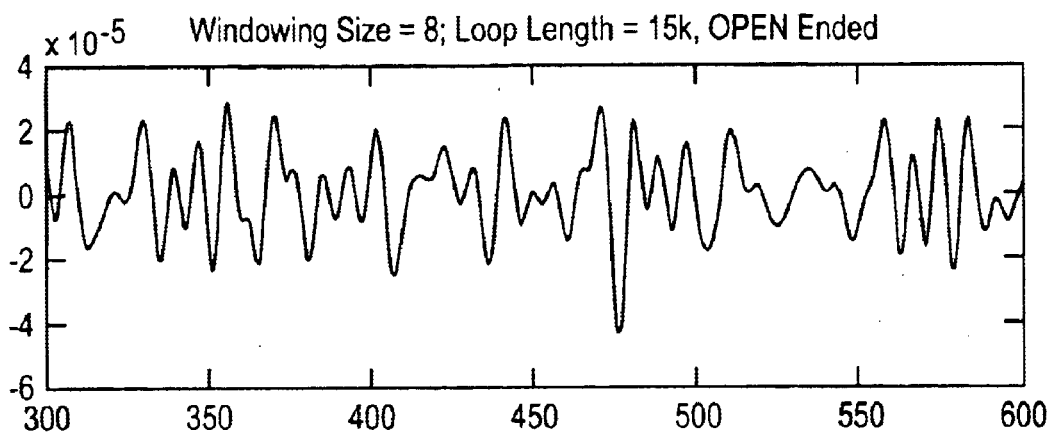
FIG. 7A is a graph illustrating the wavelet processed data output of FIG. 4B following applying the difference and smoothing.
Figure 7B:
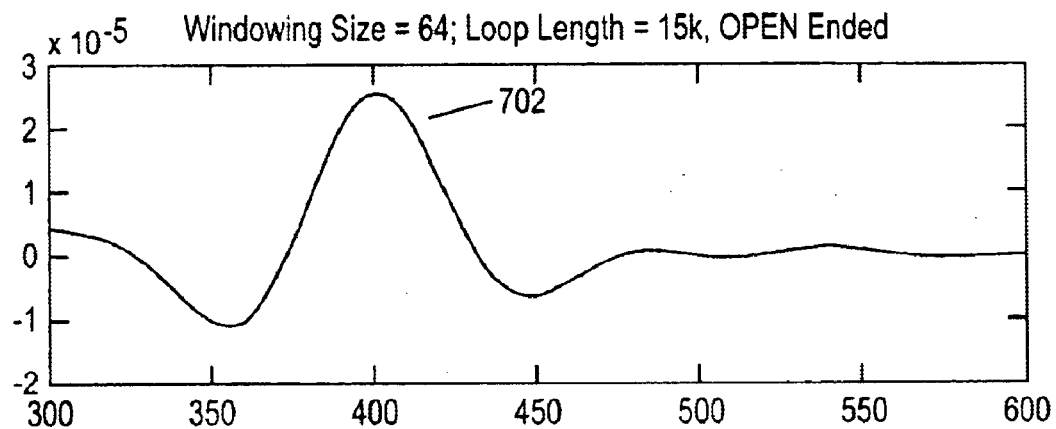
FIG. 7B is a graph illustrating the wavelet processed data output of FIG. 4C following applying the difference and smoothing.

FIGS. 7A and 7B are graphs illustrating the wavelet processed data output of FIGS. 4B and 4C, respectively, following the difference and smoothing. FIG. 7A shows BPFout(8) and FIG. 7B shows BPFout(64) for the open ended loop of length 15 kft. In this case, no significant peaks can be detected using windowing size n=8, as in FIG. 7A. When the windowing size n is set to be 64, as in FIG. 7B, the peak 702 becomes significantly larger and far more detectable. Only by using a large windowing size can the open event be detected.

Figure 8A:
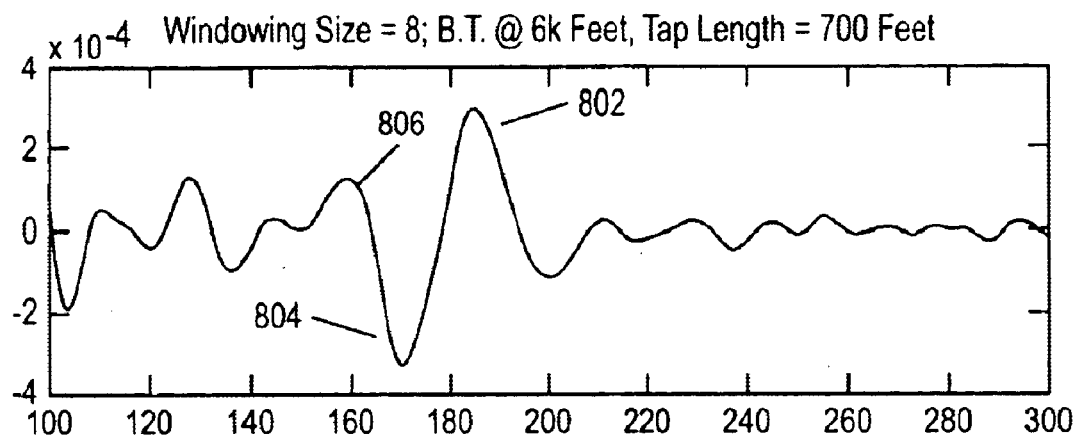
FIG. 8A is a graph illustrating the wavelet processed data output of FIG. 5B following applying the difference and smoothing.
Figure 8B:
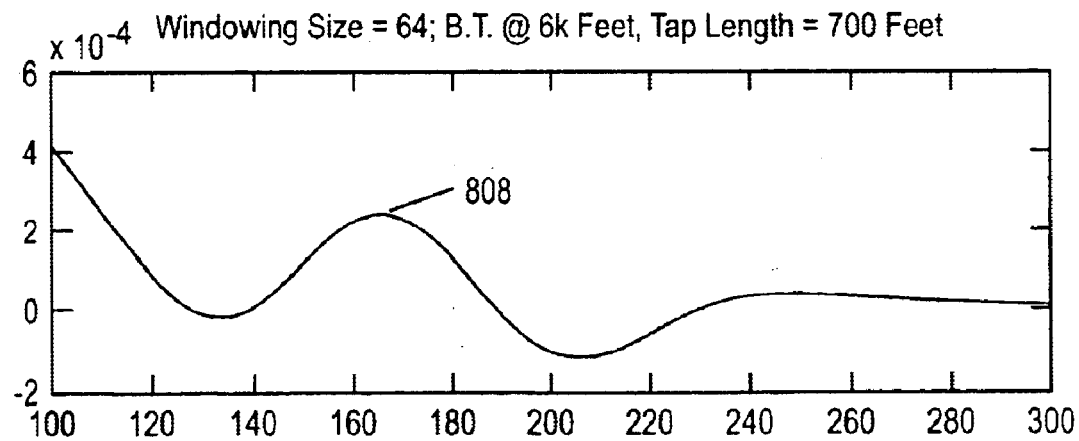
FIG. 8B is a graph illustrating the wavelet processed data output of FIG. 5C following applying the difference and smoothing.

FIGS. 8A and 8B are graphs illustrating the wavelet processed data output of FIGS. 5B and 5C, respectively, following the difference and smoothing. FIG. 8A shows BPFout(8) and FIG. 8B shows BPFout(64) for the loop with the bridge tap event located at 6 k feet and having a tap length of 700 feet. When the windowing size n is set to 8, as in FIG. 8A, the bridge tap event is separable into its component events, a shorted event 806, 804 and an open event 802. On the other hand, the peaks 802, 804, 806 due to the bridge tap event could disappear as the windowing size is increased. For example, when the windowing size n is equal to 64 as shown in FIG. 8B, both peaks due to the bridge tap event are not discernible. Here in FIG. 8B the first positive peak 808 around index 165 is the event associated with the open event at the tap end. However, in FIG. 8B the negative peak associated with the shorted event cannot be detected because of using the larger windowing size n=64.

Region Of Reflection

Figure 9:
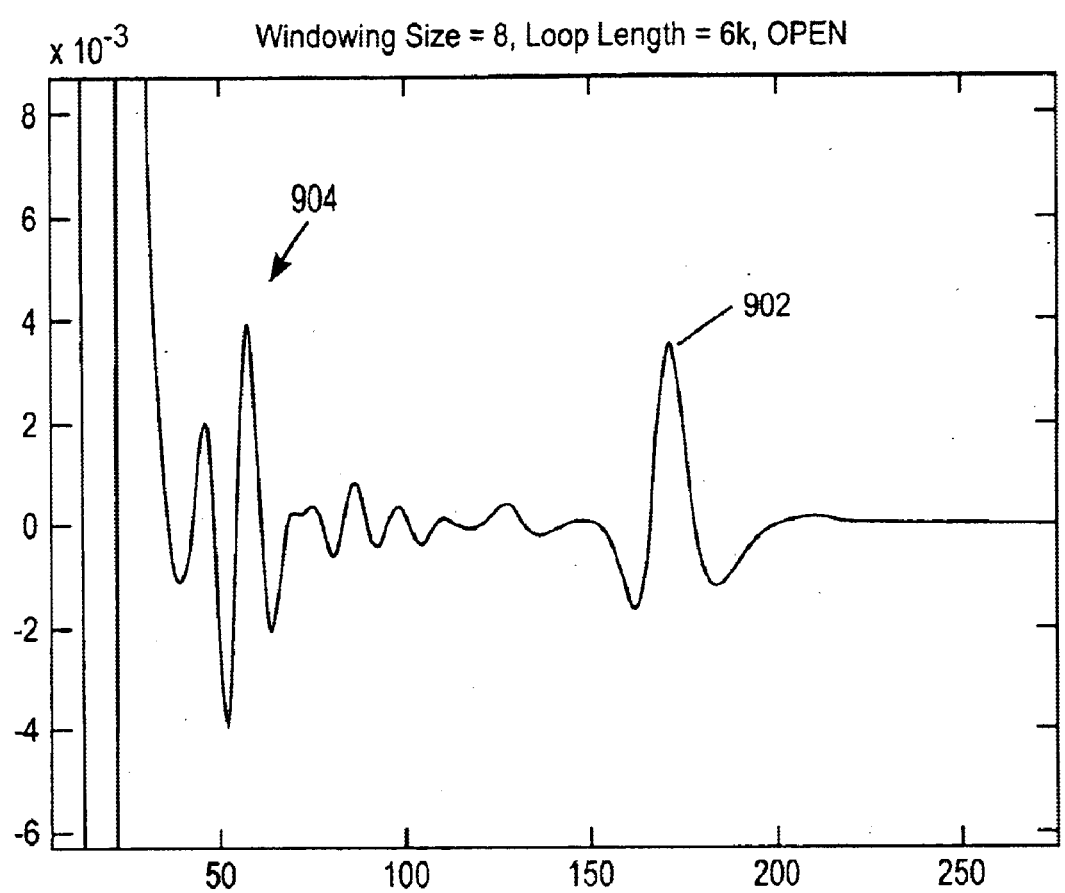
FIG. 9 is a graph illustrating a wider view of the wavelet processed data output of FIG. 3B following applying the difference and smoothing.
Figure 10A:
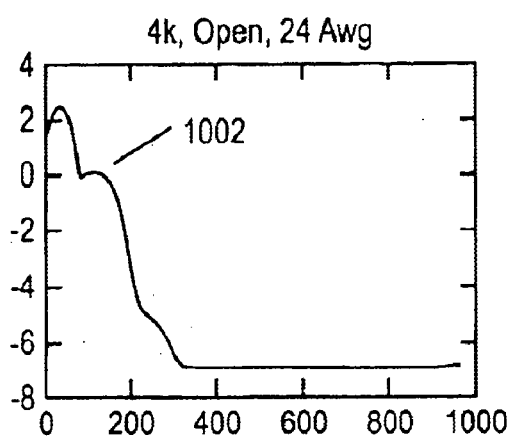
FIGS. 10A through 10D are graphs illustrating the energy envelope of data output following wavelet processing and filtering for four exemplary loop lengths.
Figure 10B:
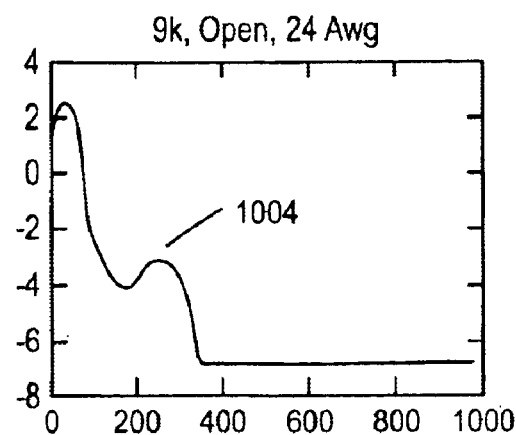
Figure 10C:
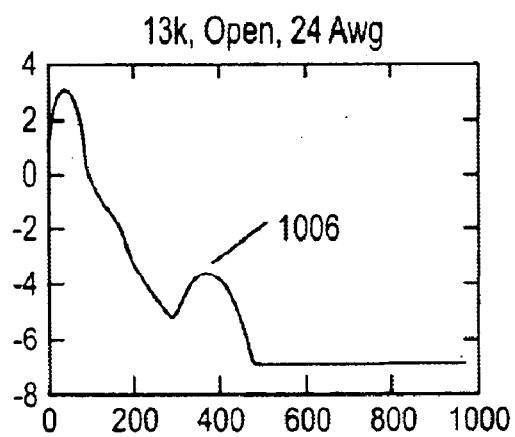
Figure 10D:
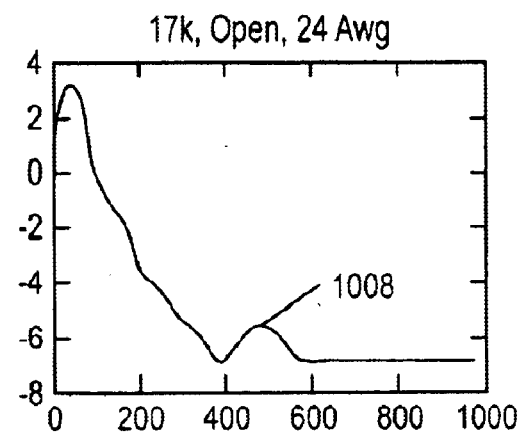
Figure 11A:
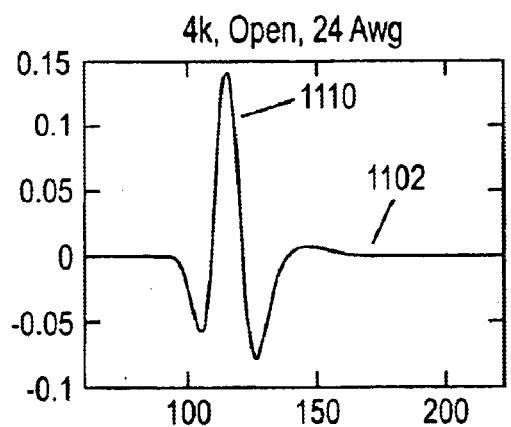
FIGS. 11A through 11D and 12A through 12D are graphs illustrating the data output in the region of reflection for the four exemplary loop lengths.
Figure 11B:
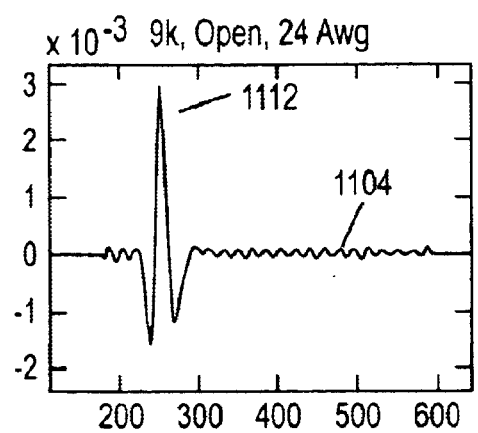
Figure 11C:
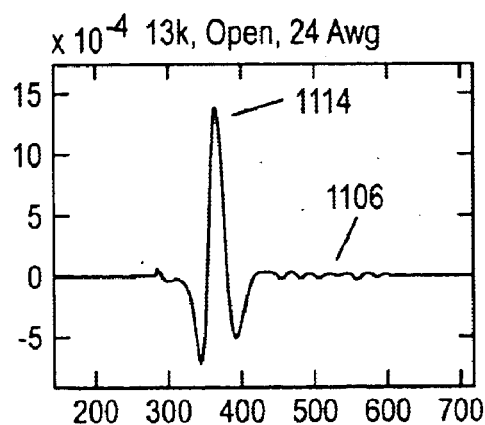
Figure 11D:
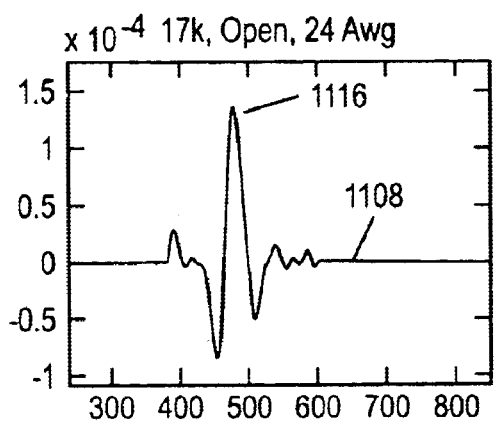
Figure 12A:
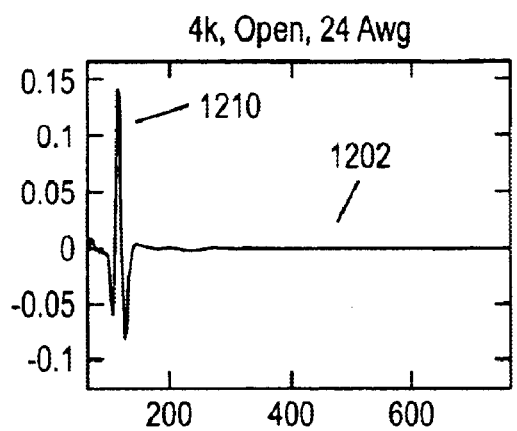
Figure 12B:
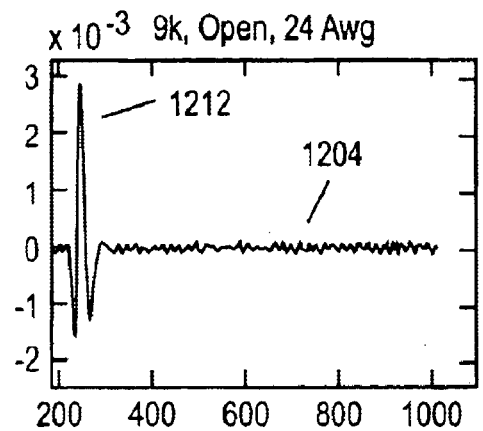
Figure 12C:
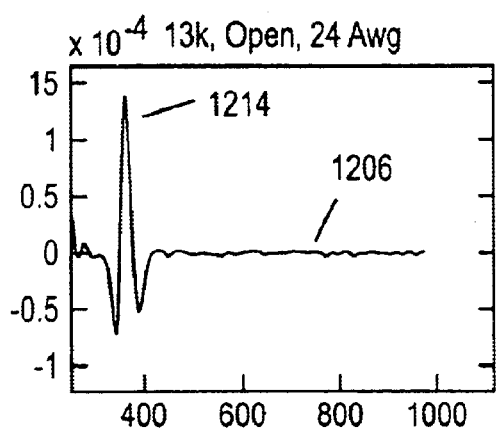
Figure 12D:
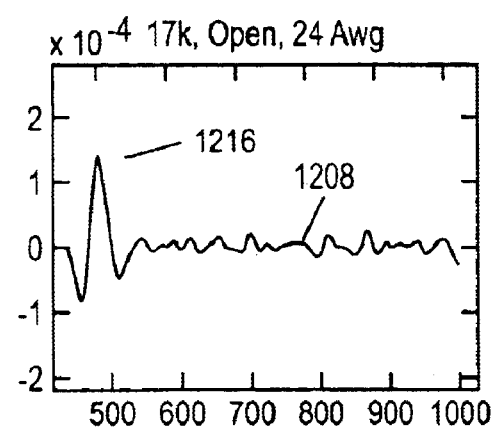

Once the output from the previous processes is obtained, the next step is to find the peaks that are associated with the reflections. Referring to FIG. 9, it is a graph illustrating a wider view than FIG. 6A of the wavelet processed data output of FIG. 3B following applying the difference and smoothing. FIG. 9 shows the data output BPFout(8) for the open ended loop of length 6 k feet. In FIG. 9, the bump 902 between indices 150 and 200 is caused by the open event. Although the peak 902 associated with the reflection appears to be the local peak around its neighborhood, the peak 902 is not a global maximum. The ripples 904 between indices 1 and 100, and particularly around and before index 50 are caused by a discontinuity in clip-off area that is hardware dependent. The ripples 904 are associated with the tail of the launch pulse or the slight discontinuity of the extrapolation in the previous processes. These ripples 904 appear to be larger than the peak 902 associated with the reflection. There is thus no simple way to locate the peak 902 associated with the real reflection.

The goal thus becomes to identify the region where reflection is located so that the ripples can be ignored and the focus can be on the peak(s) caused by the reflections. To identify the region of reflection, a moving average function is applied to the power of BPFput(n) using the following process:

```
for (int i=avgLength;i<y.length-avgLength-1;i++)
{
    moving_avg[i] = 0.0;
    for (int j=i-avgLength;j<=i+avgLength;j++)
    {
        power = BPFout[j]* BPFout[j];
        moving_avg[i] = power;
    }
}
``` where y.length is the length of the signal.

Referring now to FIGS. 10A through 10D, they are graphs illustrating the energy envelope of data output following wavelet processing and filtering for four exemplary loop lengths, 4 kft, 9 kft, 13 kft, and 17 kft, respectively on a 24 awg cable. The important characteristic to observe here is that the second bump 1002, 1004, 1006, 1008 in each of FIGS. 10A–10D is always associated with the reflections due an event. The region of the reflection is thus defined as centered on the second bump 1002, 1004, 1006, 1008. Once the center of the bump is identified with peak detection, the second derivative can be used to find the beginning and the end of the region of reflection ROR. All data points outside the ROR will be masked out to zero.

Applying Thresholds And Masking

The focus now shifts to signal analysis within the region of reflection. FIGS. 11A through 11D and 12A through 12D are graphs illustrating the data output within the region of reflection for the four exemplary loop lengths, 4 kft, 9 kft, 13 kft, and 17 kft. From FIGS. 11A through 11D and 12A through 12D, it can be observed that the tail region 1102, 1104, 1106, 1108, 1202, 1204, 1206, 1208 of the data is quite flat compared to the reflection bump 1110, 1112, 1114, 1116, 1210, 1212, 1214, 1216. A threshold is applied to the data such that only a limited number of peaks are available for the ensuing pattern classification. This is achieved by looking at the crest factor of the data segments.

The crest factor provides a way of comparing the peak value to the root mean square (rms) value of the data, for example, the noise outside the region of reflection. In a presently preferred embodiment, to obtain the threshold value, the peak value is compared to the rms value of what outside the region of reflection before masked to zero. The threshold is then chosen to pass meaningful peaks while suppress noise data.

The advantage of this approach is that an absolute threshold that needs to be determined for each type of cable need not be defined. Rather, a threshold value is defined that is adapted to the captured signal itself. If a value is less than the threshold value, then it is considered to be noise and should be zeroed out or masked out so that the signal is further cleaned up.

The following processing steps are applied to clean up the data:

1). The data outside the region of reflection and the data that are smaller than the threshold defined previously are zeroed out.

2). The peaks in the data are identified.

Figure 13:
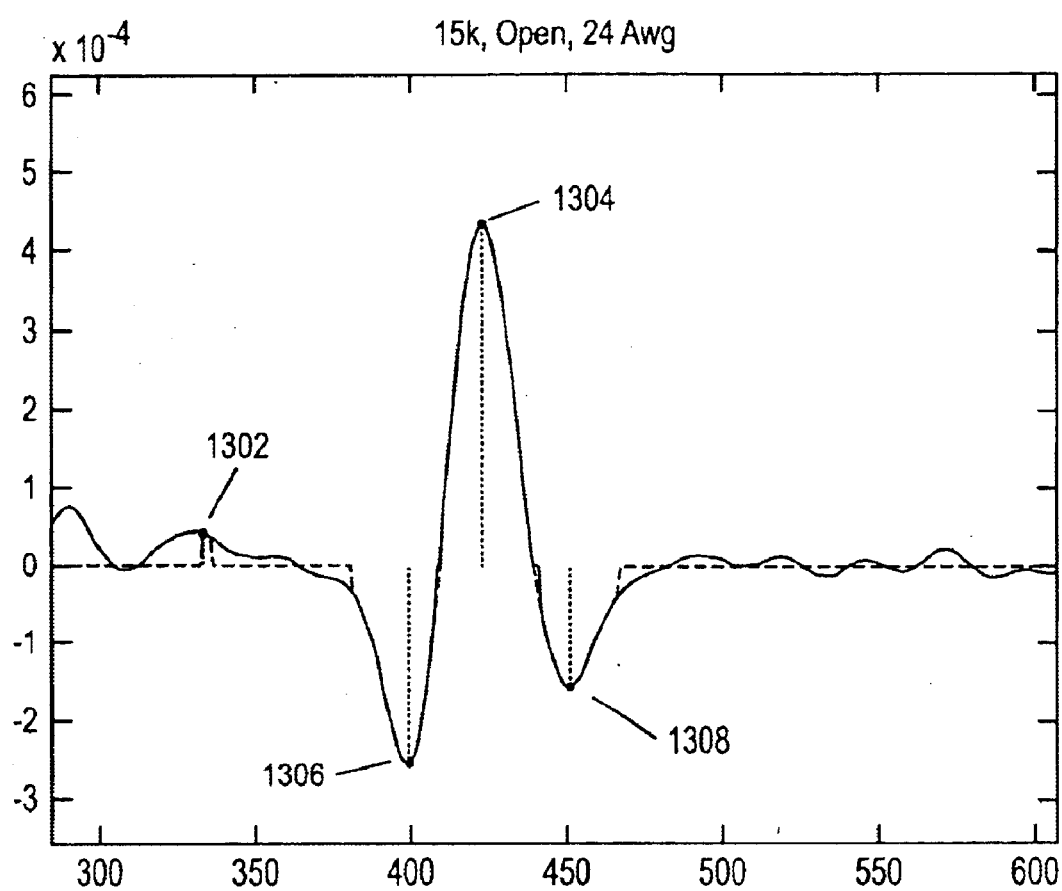
FIG. 13 is a graph illustrating the local peaks of the data output following wavelet processing and filtering within the region of reflection and above threshold values for a given loop length.
Figure 14A:
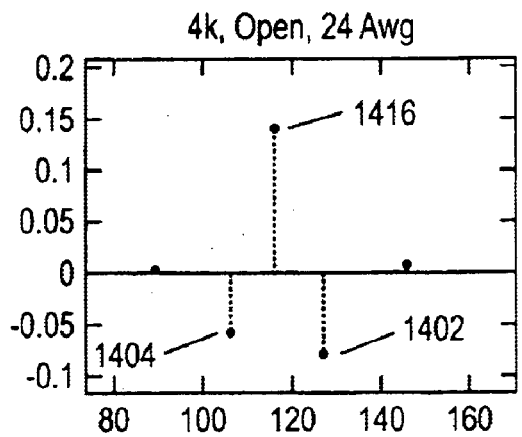
FIGS. 14A through 14D are graphs illustrating exemplary peak patterns caused by open circuit events for four exemplary loop lengths.
Figure 14B:
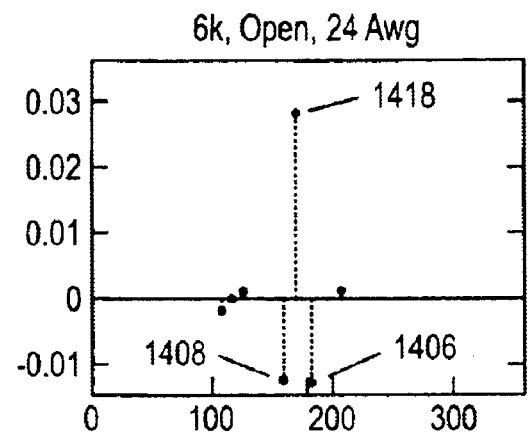
Figure 14C:
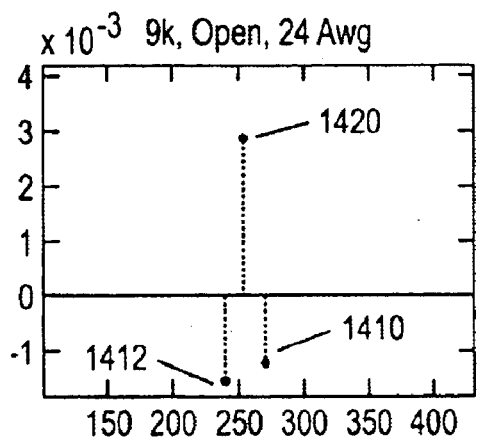
Figure 14D:
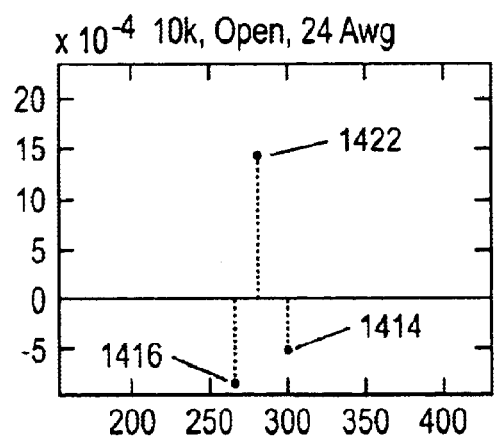

After searching for the data for peak points, the resulting data output is shown in FIG. 13, which is a graph illustrating the local peaks 1302, 1304, 1306, 1308 of the data output following wavelet processing and filtering within the region of reflection and above threshold values for a loop length of 15 kft.

Convert the Peak Pattern to Reflection Spikes and Make Inferences

In general, the open event discontinuity in the data introduces a peak pattern as shown in FIG. 13. For a shorted loop, a peak pattern in reverse polarity is observed. The objective of the following process is to map the peak pattern into an unique single peak that indicates the event point. FIGS. 14A through 14D are graphs illustrating exemplary peak patterns caused by open circuit events for the four exemplary loop lengths, 4 kft, 9 kft, 13 kft, and 17 kft.

There are two characteristics that can be observed in FIGS. 14A–14D.

1). The relative magnitude of the right side-lobe 1402, 1406, 1410, 1414 decreases as the loop becomes longer while the relative magnitude of the left-side lobe 1404, 1408, 1412, 1416 increases as the loop length increases.

2). The maximum peaks 1416, 1418, 1420, 1422 always associate with the reflection point.

Once the peak patterns are converted into a more defined pattern, inference logic is applied to the converted peak patterns. The conversion process will typically generate at most two sets of peaks in the output. The following inference for the pattern recognition is quite straightforward. If there is one set of peaks, the pattern is recognized as being indicative of an open event if the largest peaks is positive. If it is negative, then the pattern is recognized as being indicative of a shorted event or a bridge tap event. If there are two sets of peaks, then the pattern is recognized as being indicative of a bridge tap event. The distance between the two largest peaks suggests the distance of the bridged tap.

Figure 15A:
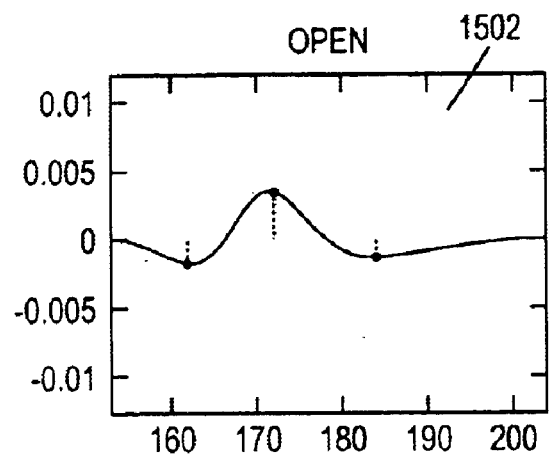
FIGS. 15A through 15D are graphs illustrating exemplary peak patterns caused by four exemplary events for a given loop length.
Figure 15B:
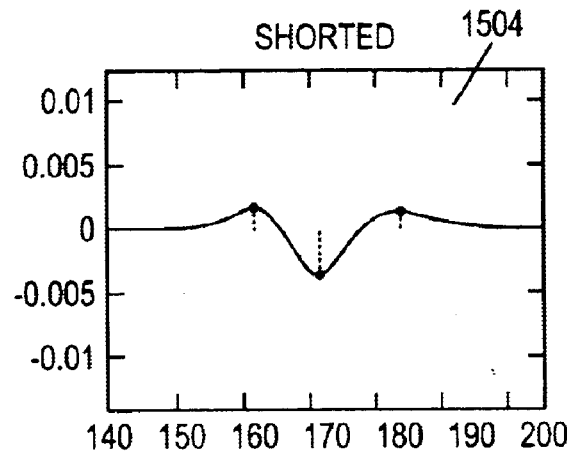
Figure 15C:
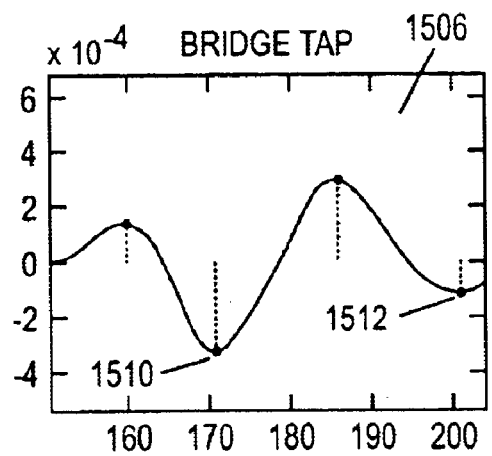
Figure 15D:
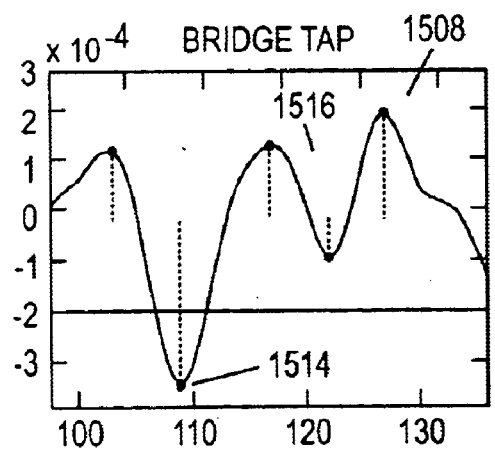

Referring to FIGS. 15A through 15D, they are graphs illustrating exemplary peak patterns caused by and associated with four exemplary events for a given loop length. The open event peak pattern 1502 in FIG. 15A is consistent with the description thus far. The shorted event peak pattern 1504 shown in FIG. 15B is in an inverse polarity to the open peak pattern 1502 shown in FIG. 15A. FIGS. 15C and 15D show the peak patterns 1506, 1508, respectively associated with bridge tap events. FIG. 15C shows the peak pattern 1506 case where the tap length is quite short such that a right hand side lobe 1510 is relatively large compared to a right hand side lobe 1512 associated with only a shorted event. FIG. 15D shows the case when the tap length is quite long such that a shorted event peak pattern 1514 is separable from an open event peak pattern 1516 that follows the shorted event peak pattern 1514.

Although the present invention has been particularly described with reference to the preferred embodiments, it should be readily apparent to those of ordinary skill in the art that changes and modifications in the form and details may be made without departing from the spirit and scope of the invention. It is intended that the appended claims include such changes and modifications.

What is claimed is:

1. A method of identifying an event representing a discontinuity in the impedance of a wire cable using time domain reflectrometry, the method comprising:
   examining a signal, the signal comprising at least one reflection pulse associated with the event on the wire cable;
   performing wavelet decomposition on successive segments of the signal over an area of the signal where the reflection pulse is expected to be located to produce a result signal, the successive segments having a window size;
   applying filtering to the result signal;
   analyzing the filtered result signal to identify a region within which the at least one reflection pulse is located, the region being smaller than the area; and
   examining the region to draw inferences to identify the event.

2. The method according to claim 1, wherein one or more of the successive segments overlap with each other.

3. The method according to claim 2, further comprising:
   isolating the region by masking the filtered result signal, the result signal having signal values, so that any signal values that are not within the region are set to zero.

4. The method according to claim 3, wherein performing wavelet decomposition comprises:
   for each successive segment,
   obtaining a sub-band signal from the successive segment using a wavelet function;
   correlating the sub-band signal to a weighted function to obtain a result signal component; and
   producing the result signal, the result signal comprised of each result signal component.

5. The method according to claim 4, wherein the wavelet function is a Harr wavelet function.

6. The method according to claim 3, further comprising:
   determining a crest factor of each peak within the region; and
   selectin peaks within the region according to the crest factor.

7. The method according to claim 6, wherein the selected peaks comprise local maxima and local minima within the region.

8. The method according to claim 6, wherein examining the region comprises:
   drawing the inferences from a peak pattern of the selected peaks; and
   identifying the event based on the inferences.

9. The method according to claim 8, wherein at least one selected peak having a largest magnitude within the region identifies a location of the at least one reflection pulse associated with the event.

10. The method according to claim 9, wherein if only one selected peak has the largest magnitude within the region and the only one selected peak is positive, the event is an open termination of the wire cable.

11. The method according to claim 9, wherein if only one selected peak has the largest magnitude within the region and he only one selected peak is negative, the event is a shorted termination of the wire cable.

12. The method according to claim 9, wherein applying filtering comprises:
   band pass filtering the result sign.

13. The method according to claim 3, wherein analyzing the filtered result signal comprises:
   finding an energy envelope of the filtered result signal.

14. A method of identifying an event representing a discontinuity in the impedance of a wire cable using time domain reflectrometry, the method comprising:
   examining a signal, the signal comprising at least one reflection pulse associated with the event on the wire cable;
   performing wavelet decomposition on first successive segments of the signal over an area of the signal where the reflection pulse is expected to be located, the first successive segments having a first window size;
   performing wavelet decomposition on second successive sets of the signal over the area, the second successive segments having a second window size;
   grouping, by the first and second window sizes, a respective first and second result signals resulting from performing wavelet decomposition on the first and second successive segments;
   applying filtering to the respective first and second result signals;
   analyzing the filtered respective first and second result signals to identify respective first and second regions within which the at least one reflection pulse is located;
   isolating the respective first and second regions; and
   examining the respective first and second regions to draw inferences to identify the event.

15. A method of identifying an event representing a discontinuity in the impedance of a wire cable using time domain reflectrometry, the method comprising:
   examining a signal, the signal comprising at least one reflection pulse associated with the event on the wire cable;

selecting a windowing size;

transforming the signal into wavelet processed output using the windowing size, a wavelet function, and a weighted function;

smoothing and differentiating the wavelet processed output to generate filtered output;

performing envelope detection on the moving average of the power on the filtered output to generate envelope detection output;

identifying at least one region of reflection within the envelope detection output;

masking the envelope detection output using the at least one region of reflection as a mask to generate a masked region of reflection output;

identifying any local maxima and local minima within the masked region of reflection output region having absolute magnitudes above a threshold using a crest factor that is adapted from the at least one region of reflection; and drawing inferences from the any local maxima and local minima.

16. A method of identifying an event representing a discontinuity in the impedance of a wire cable using time domain reflectrometry, the method comprising:

examining a signal, the signal comprising at least one reflection pulse associated with the event on the wire cable;

selecting a windowing size;

performing wavelet decomposition and match filtering of the signal according to the windowing size to generate a result signal;

repeatedly band pass filtering the result signal to produce a filtered result signal;

identifying at least one region of reflection within the filtered result signal;

identifying a peak pattern within the at least one region of reflection; and drawing an inference regarding the event by examining the peak pattern.

17. A device to identify an event representing a discontinuity in the impedance of a wire cable using time domain reflectrometry, the device comprising:

means for examining a signal, the signal comprising at least one reflection pulse associated with the event on the wire cable;

means for selecting a windowing size;

means for performing wavelet decomposition and match filtering of the signal according to the windowing size to generate a result signal;

means for repeatedly band pass filtering the result signal to produce a filtered result signal;

means for identifying at least one region of reflection within the filtered result signal;

means for identifying a peak pattern within the at least one region of reflection; and means for drawing an inference regarding the event by examining the peak pattern.

* * * * *